(12) United States Patent
Inoh et al.

(10) Patent No.: US 7,009,273 B2
(45) Date of Patent: Mar. 7, 2006

(54) SEMICONDUCTOR DEVICE WITH A CAVITY THEREIN AND A METHOD OF MANUFACTURING THE SAME

(75) Inventors: Kazumi Inoh, Yokohama (JP); Hidemi Ishiuchi, Yokohama (JP); Satoshi Matsuda, Yokohama (JP); Ichiro Mizushima, Yokohama (JP); Tsutomu Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/665,614

(22) Filed: Sep. 19, 2003

(65) Prior Publication Data

US 2004/0129998 A1    Jul. 8, 2004

(30) Foreign Application Priority Data

Sep. 19, 2002    (JP)    ............................ 2002-273409

(51) Int. Cl.
*H01L 29/00*    (2006.01)

(52) U.S. Cl. .................. 257/522; 257/499; 257/506

(58) Field of Classification Search ............... 257/499, 257/506, 522

See application file for complete search history.

(56) References Cited

U.S. PATENT DOCUMENTS

| | | | | |
|---|---|---|---|---|
| 5,567,982 A | * | 10/1996 | Bartelink | 257/664 |
| 6,570,217 B1 | | 5/2003 | Sato et al. | |
| 6,630,714 B1 | * | 10/2003 | Sato et al. | 257/350 |
| 6,670,234 B1 | * | 12/2003 | Hsu et al. | 438/246 |
| 6,830,987 B1 | * | 12/2004 | Pelella et al. | 438/421 |
| 2003/0151112 A1 | * | 8/2003 | Yamada et al. | 257/510 |

FOREIGN PATENT DOCUMENTS

| | | |
|---|---|---|
| JP | 5-206257 | 8/1993 |
| JP | 8-288381 | 11/1996 |
| JP | 2000-12858 | 1/2000 |
| JP | 2001-144276 | 5/2001 |
| JP | 2001-257358 | 9/2001 |
| JP | 2001-281051 | 10/2001 |

OTHER PUBLICATIONS

U.S. Appl. No. 09/650,748, filed Aug. 30, 2000, Sato et al.

* cited by examiner

*Primary Examiner*—Nathan J. Flynn
*Assistant Examiner*—Victor A. Mandala
(74) *Attorney, Agent, or Firm*—Frommer Lawrence & Haug LLP (57) ABSTRACT

A semiconductor device includes a semiconductor substrate, cavities, and an element isolating region. The cavities, which are each shaped like a flat plate, are made in the semiconductor substrate. The element isolating region is formed in the surface of the semiconductor substrate and located at the sides of the cavities.

15 Claims, 9 Drawing Sheets

SEMICONDUCTOR DEVICE WITH A CAVITY THEREIN AND A METHOD OF MANUFACTURING THE SAME

CROSS-REFERENCE TO RELATED APPLICATION

This application is based upon and claims the benefit of priority from the prior Japanese Patent Application No. 2002-273409, filed Sep. 19, 2002, the entire contents of which are incorporated herein by reference.

BACKGROUND OF THE INVENTION

1. Field of the Invention

This invention relates to a semiconductor device and a method of fabricating the semiconductor device. More particularly, this invention relates to techniques used for system LSIs using SON (Silicon on Nothing) substrates.

2. Description of the Related Art

It is well known that an SOI (Silicon on Insulator) has a structure where a silicon layer is formed on an insulating film. Forming semiconductor elements on such an SOI enables semiconductor integrated circuits to consume less electric power and operate at higher speeds. Methods of forming SOIs include a method of laminating two substrates together and an SIMOX (Separation by Implanted Oxygen) method. SOIs, however, have the disadvantages that they are higher in manufacturing cost and that it is difficult to form a silicon layer with defect-free.

With this backdrop, an SON structure where a silicon layer is provided at the top of a cavity has lately attracted attention. It is safe to say that the SON is the final SOI structure. The SON has the same merits as those of the SOI. The SON is currently under intensive investigation. For example, a method of insulating a silicon layer from a semiconductor substrate has been disclosed in Jpn. Pat. Appln. KOKAI Publication No. 5-206257. An SON manufacturing method capable of micro-fabrication has been disclosed in Jpn. Pat. Appln. KOKAI Publication No. 8-288381. A method of manufacturing double-gate MOS transistors using SONs has been disclosed in Jpn. Pat. Appln. KOKAI Publication No. 2001-257358. An infrared sensor using SON has been disclosed in Jpn. Pat. Appln. KOKAI Publication No. 2001-281051. From these, it can be seen that the study of SON has covered various fields.

Figure 1:
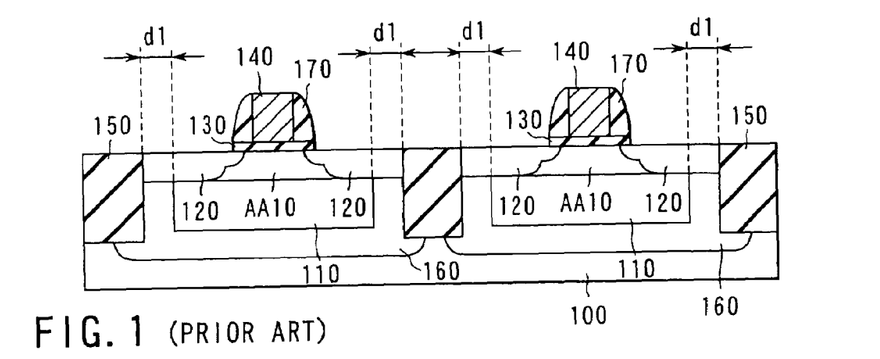
FIG. 1 is a sectional view of a conventional semiconductor device.

The configuration of a conventional semiconductor device using an SON structure will be explained by reference to FIG. 1 (for further details, refer to, for example, Jpn. Pat. Appln. KOKAI Publication No. 2001-144276). FIG. 1 is a sectional view of a MOS transistor formed on an SON substrate.

As shown in FIG. 1, cavities 110 are made in a semiconductor substrate 100. Then, source and drain regions 120, 120 are formed in an element region AA10 located at the top of the cavity 110. A gate electrode 140 is formed on the element region AA10 with a gate insulating film 130 interposed therebetween, thereby forming a MOS transistor. A sidewall insulating film 170 is formed on the sidewall of the gate electrode 140. Adjacent MOS transistors are electrically separated from one another by an element isolating region 150 formed between them. The element isolating region 150 is formed normally using STI (Shallow Trench Isolation) techniques from the viewpoint of the micro-fabrication of elements.

As described above, the use of SON has been encouraging an attempt to cause semiconductor integrated circuits to consume less power and operate at higher speeds. It is expected that SON will be applied to system LSIs embedded, for example, DRAM (Dynamic Random Access Memory) in the future.

The conventional SON structure, however, tends to make the micro-fabrication of semiconductor devices difficult.

Specifically, as shown in FIG. 1, when SON and STI techniques are used, the element isolating region 150 has to be prevented from exposing to the cavity 110. The reason is that, in the STI technique, trenches are formed in a semiconductor substrate and then, the trenches are filled with an insulating film, thereby forming an element isolating region. If the trenches are exposed to the cavities 110, what supports the element region AA10 will be lost. To avoid this problem, a distance of, for example, d1 is allowed between the cavity 110 and the element isolating region 150. Depending on the situation, the clearance makes a totally useless region, which contributes to an increase in the element area.

Furthermore, in the conventional structure, the region between the cavities 110 and the element isolating region 150 electrically connects the element regions AA10 with the semiconductor substrate 100. To solve this problem, well regions 160, which are unnecessary in the SOI structure, must be used to electrically separate the element region AA10 from the semiconductor substrate 100. As a result, it is difficult to narrow the distance between adjacent semiconductor elements, which may interfere with the micro-fabrication of semiconductor devices.

BRIEF SUMMARY OF THE INVENTION

A semiconductor memory device according to an aspect of the present invention, comprises: a semiconductor substrate; a flat-plate-shaped cavity made in the semiconductor substrate; and an element isolating region formed in the surface of the semiconductor substrate and located at the sides of the cavity, the cavity being wider than an element region provided on the cavity, wherein the element isolating region is less deep than the cavity and deeper than the element region.

A method of fabricating a semiconductor device according to another aspect of the present invention comprises:

making flat-plate-shaped cavities partly in a semiconductor substrate;

forming an insulating film in the surface of the semiconductor substrate between adjacent ones of the cavities in such a manner that a part of the insulating film is exposed to the cavities so as to electrically separate element regions provided on the adjacent cavities from each other each cavity being wider than each element region; and forming semiconductor elements on the element regions.

DETAILED DESCRIPTION OF THE INVENTION

Figure 2A:
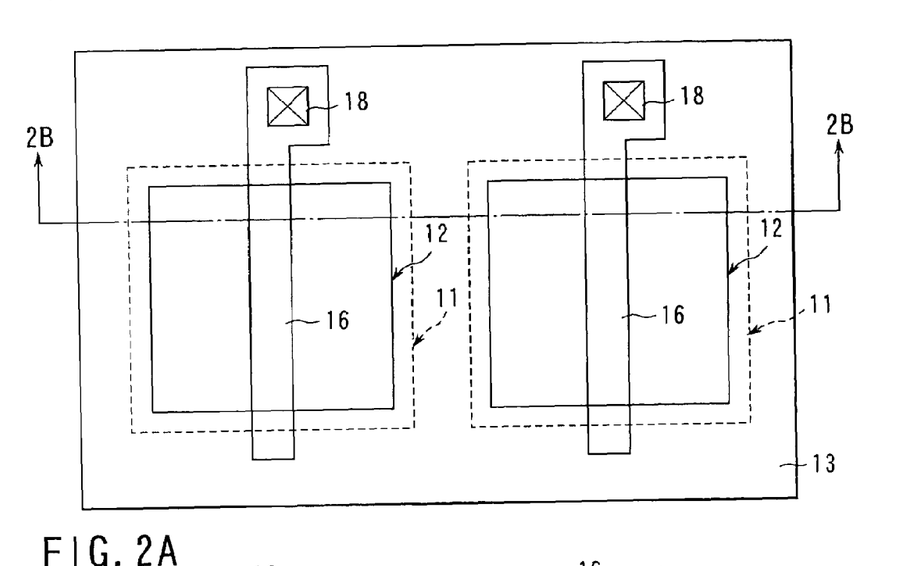
FIG. 2A is a plan view of a semiconductor device according to a first embodiment of the present invention.
Figure 2B:
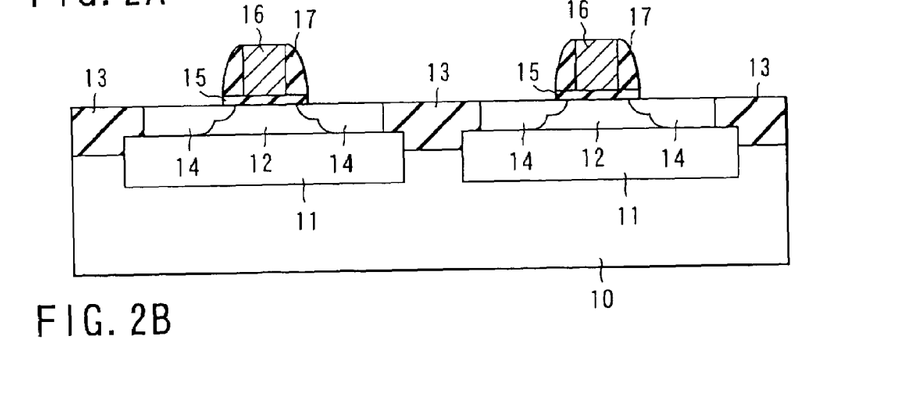
FIG. 2B is a sectional view taken along line 2B—2B of FIG. 2A.

A semiconductor device according to a first embodiment of the present invention and a method of manufacturing the semiconductor devices will be explained by reference to FIG. 2A and FIG. 2B. FIG. 2A is a plan view of MOS transistors using SON. FIG. 2B is a sectional view taken along line 2B—2B of FIG. 2A.

As shown in FIGS. 2A and 2B, semiconductor layers 12 are formed above a semiconductor substrate 10. Flat-shaped cavities 11 are located between the semiconductor substrate 10 and semiconductor layers 12. The area of the surface (or back surface) of the semiconductor layer 12 is smaller than the area of the top (or the bottom) of the cavity 11. The semiconductor layer 12 overlaps with the cavity 11. That is, the back surface of the semiconductor layer 12 is exposed to the cavity 11. Around the semiconductor layer 12, an element isolating region 13 is formed. The element isolating region 13 is also formed in the semiconductor substrate 10 between adjacent cavities 11 in such a manner that the region 13 is located at the sides of the cavities 11 in the semiconductor substrate 10. A part of the element isolating region 13 is exposed to the cavity 11. Consequently, the semiconductor layer 12 has its bottom surface surrounded by the cavity and its side faces enclosed by the element isolating region 13, thereby being electrically separated from the semiconductor substrate 10. The element isolating region 13 is formed so as to be less deep than the bottom of the cavity 11 and deeper than the top of the cavity 11 from the surface of the semiconductor substrate 10.

In the semiconductor layer 12, source and drain regions 14, 14 are so formed that they are separated from each other. A gate electrode 16 is formed on the semiconductor layer 12 between the source and drain regions 14, 14 with a gate insulating film 15 interposed therebetween. A sidewall insulating film 17 is formed on the sidewall of the gate electrode 16.

The gate electrode 16 is extended in a specific direction and has its end drawn across the semiconductor layer 12 onto the element isolating region 13. Then, a potential is applied to the gate electrode 16 at a contact region 18 formed on the element isolating region 13.

As described above, a MOS transistor including the source and drain regions 14, 14, gate insulating film 15, and gate electrode 16 is formed on the SON structure.

Next, a method of manufacturing the semiconductor device will be explained by reference to FIG. 3A to FIG. 3I.

FIG. 3A to FIG. 3I are sectional views successively showing the manufacturing steps of the semiconductor device.

Figure 3A:
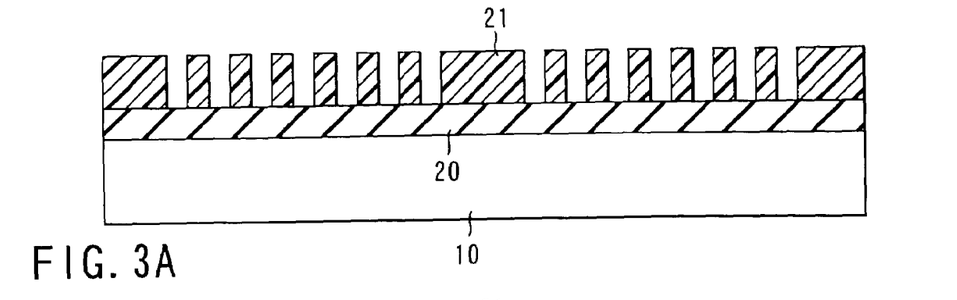
FIG. 3A to FIG. 3I are sectional views successively showing the manufacturing steps of the semiconductor devices according to the first embodiment.

As shown in FIG. 3A, a mask material 20 is formed on the semiconductor substrate (e.g., a silicon substrate) 10. The mask material 20 is, for example, a silicon oxide film or a multi-layer including the silicon oxide film and silicon nitride film. Next, a photo-resist 21 is coated on the mask material 20. Then, the photo-resist 21 is patterned by photolithography as shown in figure.

Figure 3B:
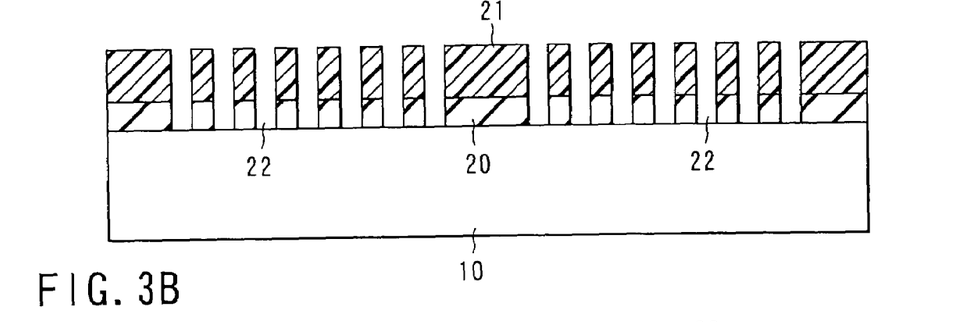

Next, the mask material 20 is etched by anisotropic etching, such as RIE (Reactive Ion Etching) using the photo-resist 21 as a mask. As a result, the mask material 20 is patterned the same as the photo-resist 21, as shown in FIG. 3B.

Figure 3C:
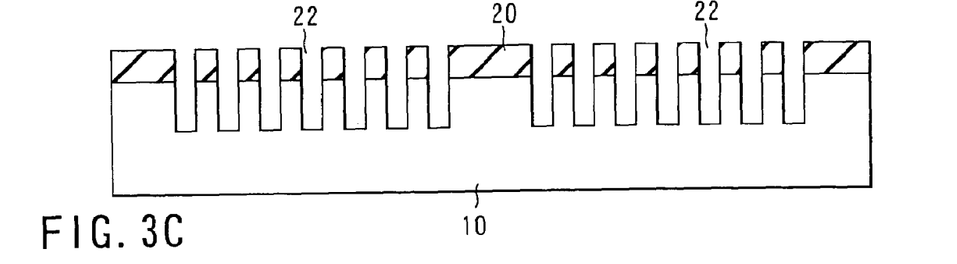

Then, the photo-resist 21 is removed by ashing method. As shown in FIG. 3C, with the patterned mask material 20 as a mask, the semiconductor substrate 10 is etched by RIE, thereby forming a plurality of trenches 21. Consequently, it is desirable that the material which has large difference in etching rate with silicon is used as mask material 20. For example, the silicon oxide film or multi-layer including the silicon oxide film and silicon nitride film is used. The trenches 22 are formed in regions where the cavities 11 are to be made. The radius of an opening, depth of the trench and distance between adjacent trenches are about 0.2 $\mu$m, 2 $\mu$m and 0.7 $\mu$m, respectively. For making a cavity 11, the distance D between adjacent trenches is set at a value given by the following equation:

$$D < 3.5R$$

where R represents the radius of the opening of the trench.

Figure 3D:
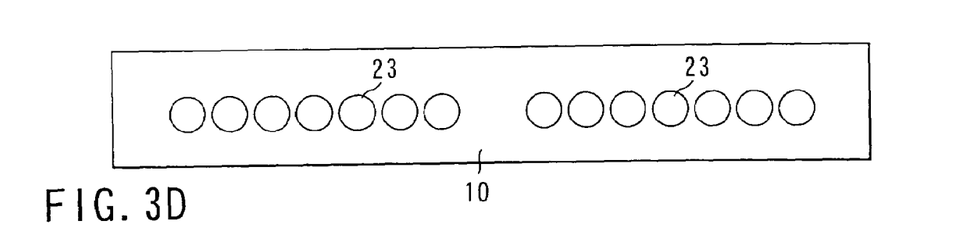
Figure 3E:
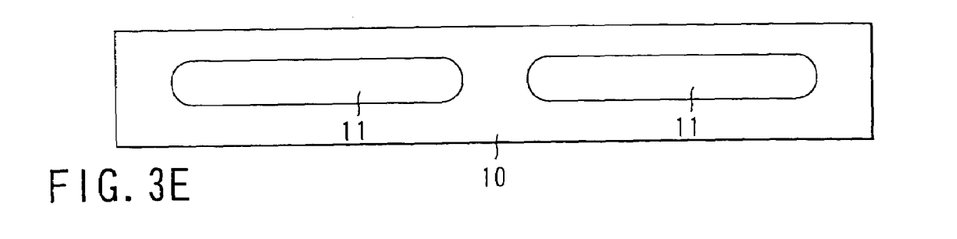

Next, the mask material 20 is removed. Then, high-temperature annealing is executed at a temperature of about 1,100° C. in a non-oxidizing atmosphere, such as 100% Hydrogen, under low-pressure of 10 torr. As a result, cavities 23 are made a result of the openings of the trenches 22 being closed as shown in FIG. 3D. The annealing is further continued, thereby integrating the cavities 23 into units, which makes flat-plate-shaped cavities 11 as shown in FIG. 3E. This phenomenon is caused by the surface migration of the silicon to minimize a surface energy of the silicon substrate after removing the silicon oxide film (mask material 20) on the silicon substrate.

Figure 3F:
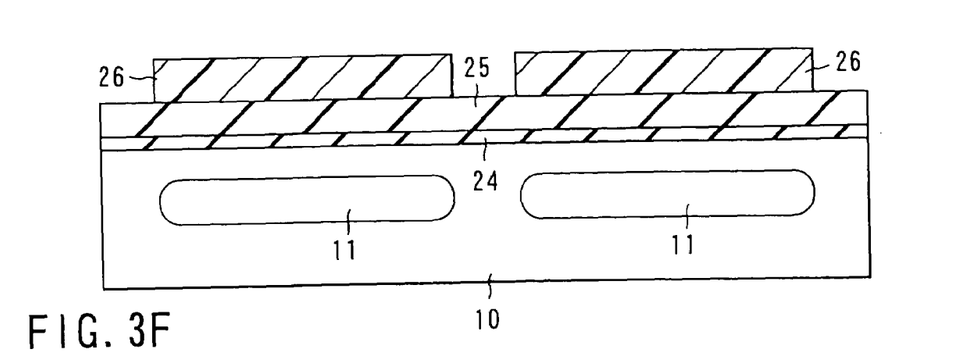

Next, an element isolating region 13 is formed by LOCOS (LOCal Oxidation of Silicon) method. Specifically, as shown in FIG. 3F, a mask material, such as a silicon oxide film 24 and silicon nitride film 25, is formed on the semiconductor substrate 10 by CVD (Chemical Vapor Deposition) method. Then a photo-resist 26 is coated on the silicon nitride film 25. Thereafter, the photo-resist 26 is patterned by photolithography as shown in figure. That is, the photo-resist 26 on the regions where the element isolating region 13 is to be formed is removed. The region where the element isolating region 13 is to be formed is the region which is between adjacent cavities 11 and region which surrounds a part of the silicon substrate on the cavities 11.

Figure 3G:
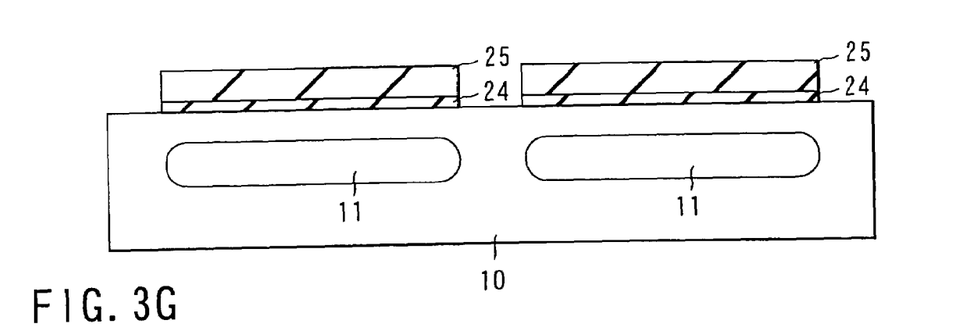

Next, the silicon nitride film 25 and silicon oxide film 24 is sequentially etched by RIE using the photo-resist 26 as a mask. As a result, the silicon nitride film 25 and silicon oxide film 24 is patterned the same as the photo-resist, as shown in FIG. 3G. After that, the photo-resist 26 is removed by ashing method.

Figure 3H:
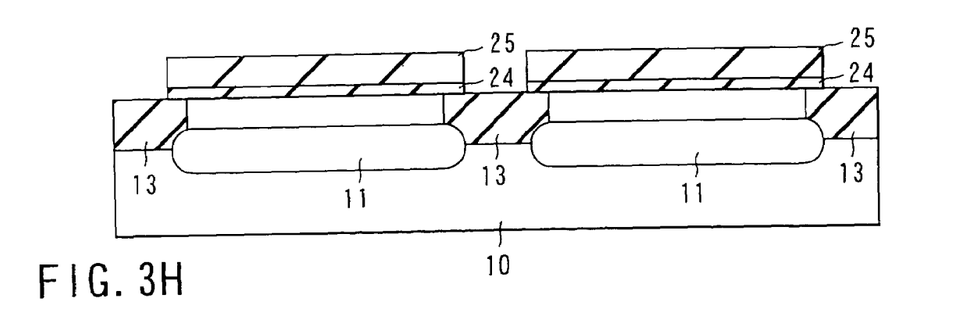

Then, the surface of the silicon substrate 10 exposed with the patterned silicon oxide film 24 and silicon nitride film 25 is oxidized by, for example, wet oxidizing method. As a result, the silicon oxide film obtained by oxidizing the semiconductor substrate 10 forms an element isolating region 13. At this time, the element isolating region 13 is so formed that it reaches the cavities 11.

Figure 3I:
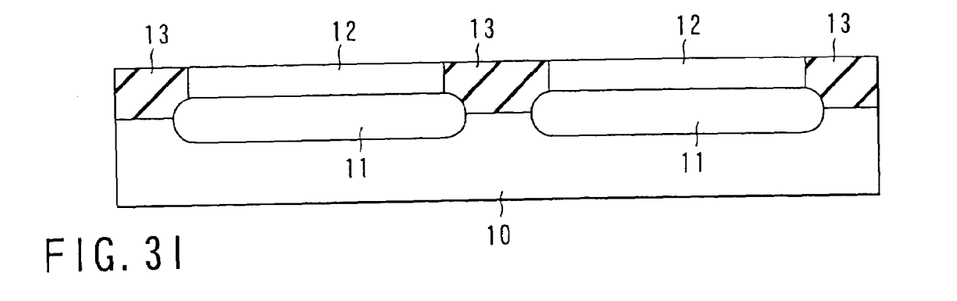

Next, the silicon oxide film 24 and silicon nitride film 25 are removed. As a result, a SON substrate as shown in FIG. 3I is completed. Let the region above the cavity 11 in the semiconductor substrate 10 be referred to as a semiconductor layer 12. Then, the semiconductor layer 12 overlaps completely with the cavity 11, with the back surface of the layer 12 exposed to the cavity 11. That is, the area of the top of each cavity 11 is larger than the area of the back surface of the semiconductor layer 12. The side face of the semiconductor layer 12 is enclosed by the element isolating region 13. Consequently, the semiconductor layer 12 is electrically separated from the semiconductor substrate 10.

Thereafter, source and drain regions 14 are formed in the semiconductor layer 12 and gate electrodes 16 are formed on the semiconductor layer 12 using well-known techniques, which completes a MOS transistor shown in FIGS. 2A and 2B.

As described above, in the semiconductor device and the method of manufacturing the semiconductor device in according to the first embodiment of the present invention, the element isolating region 13 is formed in the surface of the silicon substrate between adjacent ones of cavities 11 by LOCOS techniques. Therefore, unlike the use of STI techniques, the use of LOCOS techniques enables the element isolating region 13 to be formed in such a manner that it is located at the sides of the cavities 11. Consequently, a part of the element isolating region 13 is exposed to the sides of the cavity 11. That is, there is no need to allow a useless space between the cavities 11 and the element isolating region 13. In other words, the semiconductor layers 12 are supported by the element isolating regions 13. Moreover, the lower surface of each semiconductor layer 12 is exposed to a cavity 12 and the element isolating region is so formed that reaches the cavity from surface of the silicon substrate. Consequently, the cavities 11 and element isolating region 13 electrically separate the semiconductor layers 12 from the semiconductor substrate 10, so that well separation is not necessary differently to conventional equivalents. Therefore, the area occupied by semiconductor elements can be reduced and therefore the semiconductor device can be further miniaturized. This leads to a reduction in the manufacturing cost of semiconductor devices.

If a semiconductor layer 12 is defined as one element region AA, the element region AA and a cavity 11 are formed in a one-to-one correspondence. That is, the cavity 11 is nearly as wide as the element region AA, which means that a relatively small size of the cavity is sufficient. Therefore, the processes of manufacturing semiconductor devices can be simplified and the manufacturing yield can be improved. While in the first embodiment, one MOS transistor has been formed in one element region AA (or semiconductor layer 12), a plurality of semiconductor elements electrically connected may be formed in one element region AA.

Figure 4A:
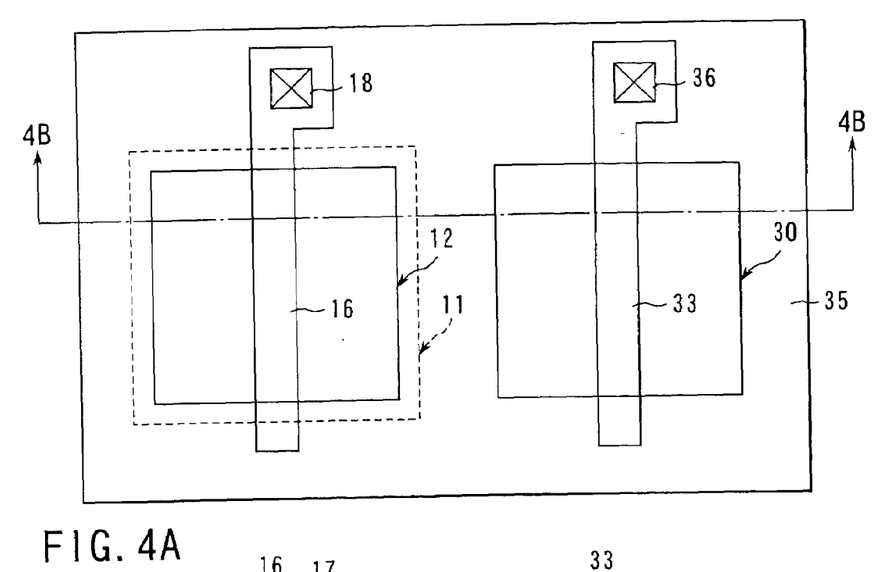
FIG. 4A is a plan view of a semiconductor device according to a second embodiment of the present invention.
Figure 4B:
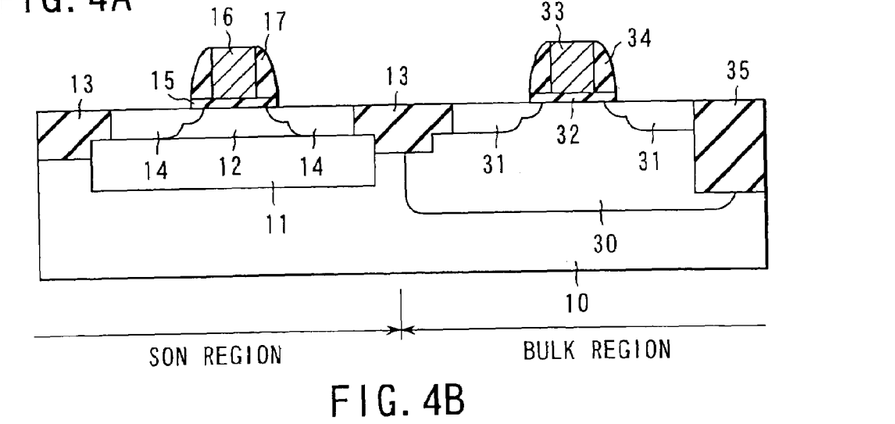
FIG. 4B is a sectional view taken along line 4B—4B of FIG. 4A.

A semiconductor device according to a second embodiment of the present invention and a method of manufacturing the semiconductor devices will be explained by reference to FIG. 4A and FIG. 4B. FIG. 4A is a plan view of MOS transistors using SON. FIG. 4B is a sectional view taken along line 4B—4B of FIG. 4A.

As shown in the figures, a semiconductor device according to the second embodiment includes an SON region where a cavity 11 is made and a bulk region where no cavity 11 is made. Since the structure of the SON region is the same as in the first embodiment, its explanation will be omitted.

In the bulk region, a well region 30 is formed in the surface of the semiconductor substrate 10. In the surface of the well region 30, source and drain regions 31, 31 are so formed that they are separated from each other. On the well region 30 between the source and drain regions 31, 31, a gate electrode 33 is formed with a gate insulating film 32 interposed therebetween. On the sidewall of the gate electrode 33, a sidewall insulating film 34 is formed.

A MOS transistor in the bulk region formed as described above is enclosed by an element isolating region 13 and an element isolating region 35. The gate electrode 33 is extended in a specific direction and has its end drawn across the well region 30 onto the element isolating region 35. Then, a potential is applied to the gate electrode 33 at a contact region 36 formed on the element isolating region 35.

Next, a method of manufacturing the semiconductor device will be explained by reference to FIG. 5A to FIG. 5E. FIG. 5A to FIG. 5E are sectional views successively showing the manufacturing steps of the semiconductor device according to the second embodiment.

Figure 5A:
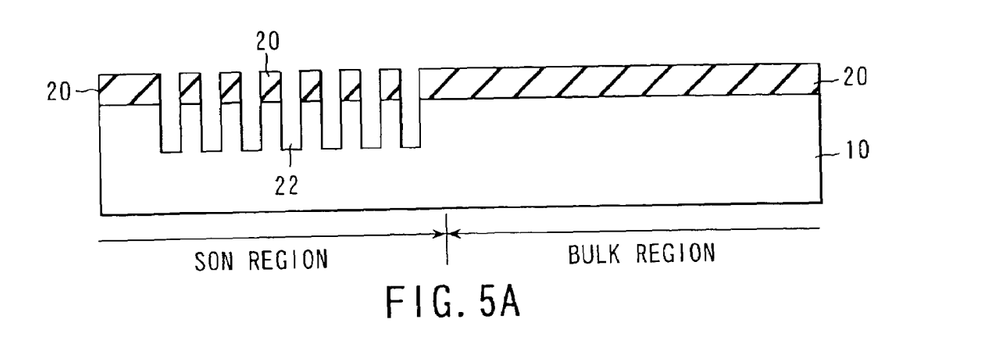
FIG. 5A to FIG. 5E are sectional views successively showing the manufacturing steps of the semiconductor devices according to the second embodiment.

According to the manufacturing steps explained in the first embodiment, a cavity 11 is made and an element isolating region 13 are formed in an SON region in the semiconductor substrate (e.g., a silicon substrate) 10. That is, as shown in FIG. 5A, trenches 21 are made in the SON region of the semiconductor substrate 10. These trenches 22 are formed in the regions where cavities 11 are to be made.

Figure 5B:
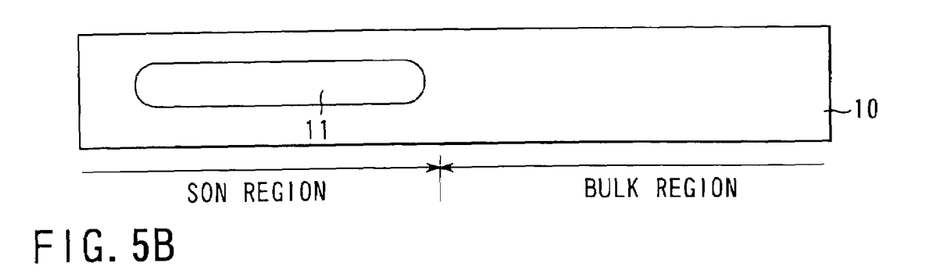

Next, as shown in FIG. 5B, the mask material 20 is removed and high-temperature annealing is done in a non-oxidizing atmosphere. As a result, a flat-plate-shaped cavity 11 as shown in the figure is made in the SON region.

Figure 5C:
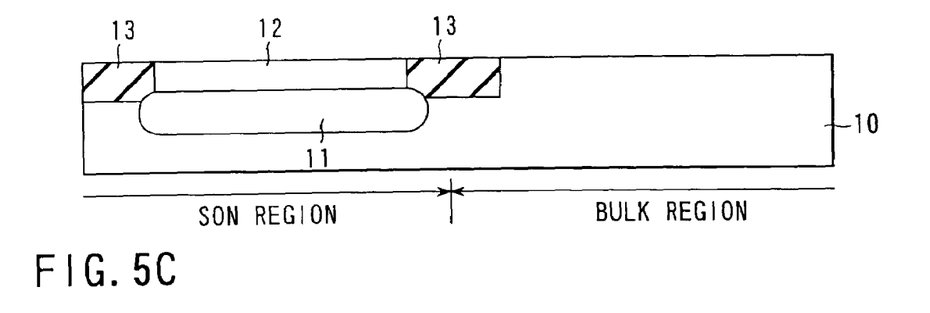

Then, as shown in FIG. 5C, an element isolating region 13 is formed in the SON region by LOCOS techniques. The element isolating region 13 is so formed in the semiconductor substrate 10 that it is located at the sides of the cavity 11. Therefore, a part of the element isolating regions 13 is exposed to cavity 11.

Figure 5D:
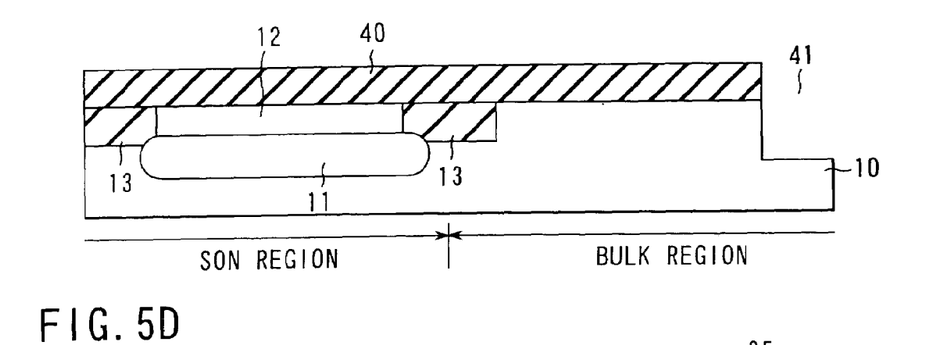

Next, an element isolating region 35 is formed in the bulk region of the semiconductor substrate 10 by STI techniques. That is, a mask material 40 is first formed on the semiconductor substrate 10 by CVD techniques. The mask material 40 is, for example, a silicon oxide film or a silicon nitride film. Then, the mask material 40 is patterned by photolithography and RIE, thereby removing the mask material 40 in the region where an element isolating region 35 is to be formed. Furthermore, with the patterned mask material 40 as a mask, the semiconductor substrate 10 is etched, thereby forming a trench 41 in the bulk region of the semiconductor substrate 10 as shown in FIG. 5D.

Figure 5E:
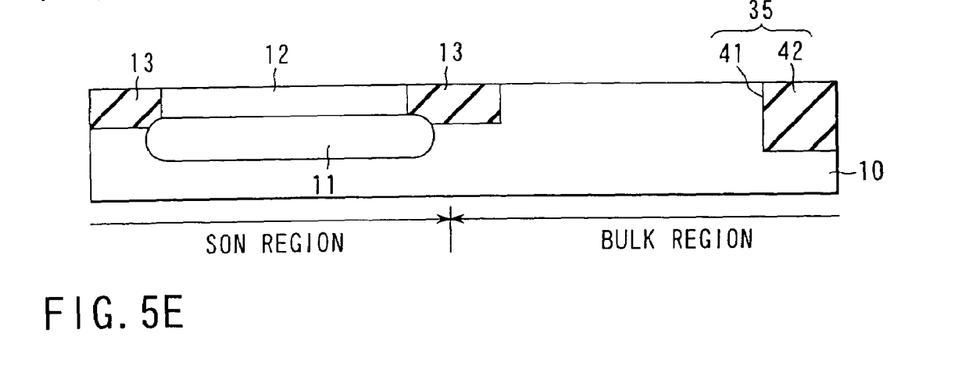

Next, the trench 41 is filled with an insulating film, such as a silicon oxide film and the mask material 40 is removed, thereby forming an element isolating region 35.

Therefore, a well region 30 is formed in the bulk region by ion implantation techniques or the like. Furthermore, a MOS transistor is formed in each of the SON region and bulk region by a well-known method, which completes a structure shown in FIGS. 4A and 4B.

In the semiconductor device and the method of manufacturing the semiconductor device according to the second embodiment, the element isolating region 13 in the SON region has been formed by the LOCOS techniques. Consequently, the same effect as that of the first embodiment is obtained.

In the structure according to the second embodiment, the SON region with a cavity 11 and the bulk region with no cavity 11 are made in the same semiconductor substrate. The reason for this will be explained.

In a system LSI, whether the use of SON is good or not varies from circuit to circuit. This is because the SON has a floating body effect inherent therein. Specifically, since the semiconductor layer 12 in the SON region is electrically isolated from the semiconductor substrate 10, the potential of the semiconductor layer 12 is floating. Thus, it is desirable that a semiconductor element that carries out digital operations should be formed on the semiconductor layer 12. On the other hand, it is undesirable that a semiconductor element that carries out analog operations should be formed on the semiconductor layer 12 whose potential is unstable.

With the second embodiment, whether the MOS transistor on the SON (or semiconductor layer 12) or the MOS transistor on the semiconductor substrate 10 is used can be determined, depending on the characteristics of the semiconductor element. Thus, it is possible to realize a high-speed, high-performance system LSI.

Figure 6A:
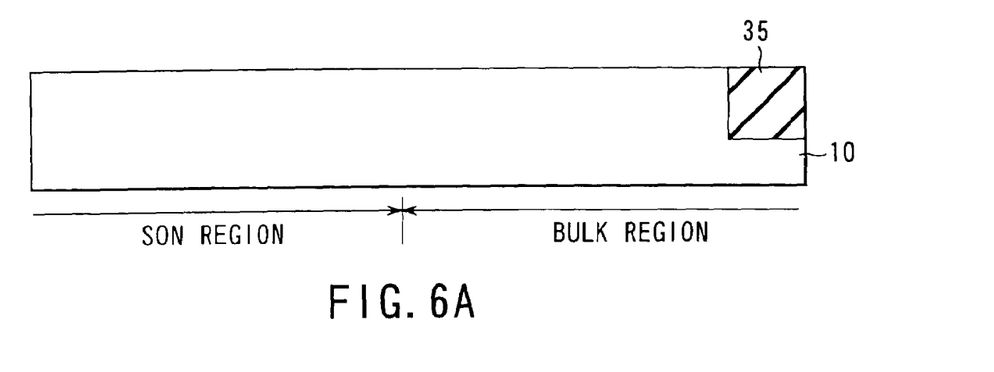
FIG. 6A to FIG. 6C are sectional views successively showing the manufacturing steps of the semiconductor devices according to a modification of the second embodiment.
Figure 6B:
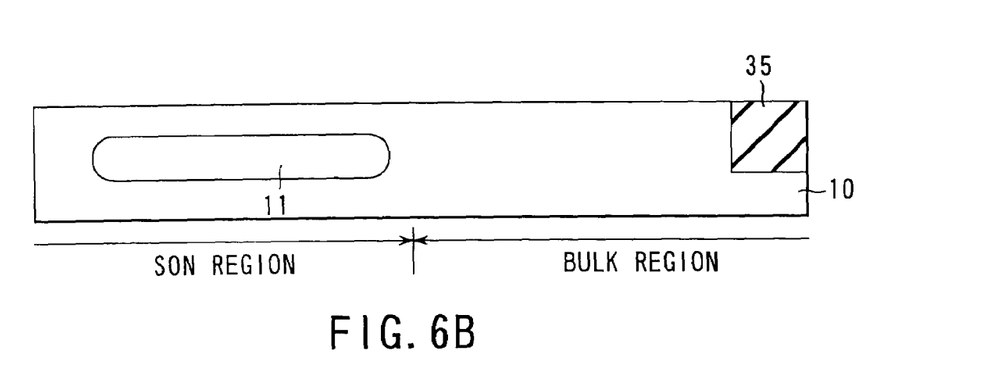
Figure 6C:
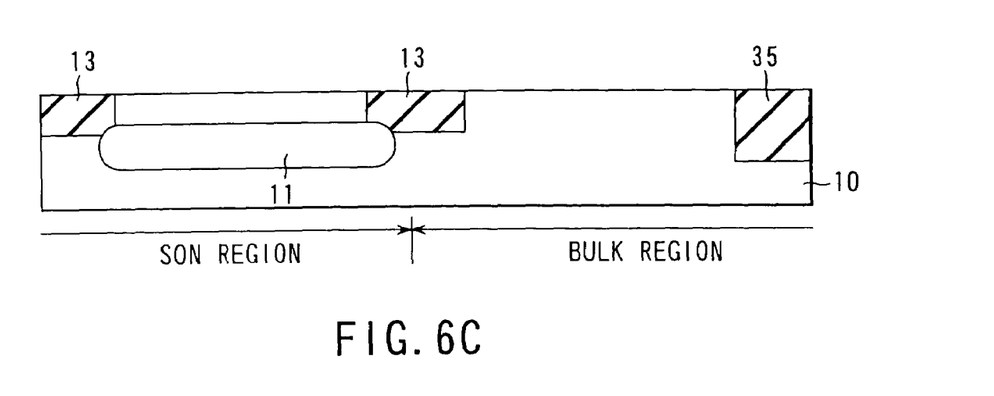

The method of forming the SON region and bulk region in the same semiconductor substrate 10 is not limited to the method shown in FIGS. 5A and 5B. FIGS. 6A to 6C are sectional views successively showing the manufacturing steps of the semiconductor device according to a modification of the second embodiment.

As shown in FIG. 6A, an element isolating region 35 is formed in the bulk region by STI techniques. Then, as shown in FIG. 6B, a flat-plate-shaped cavity is formed in the SON region. Thereafter, as shown in FIG. 6C, an element isolating region 13 so formed in the semiconductor substrate 10 that located at the sides of the cavity 11.

Figure 7A:
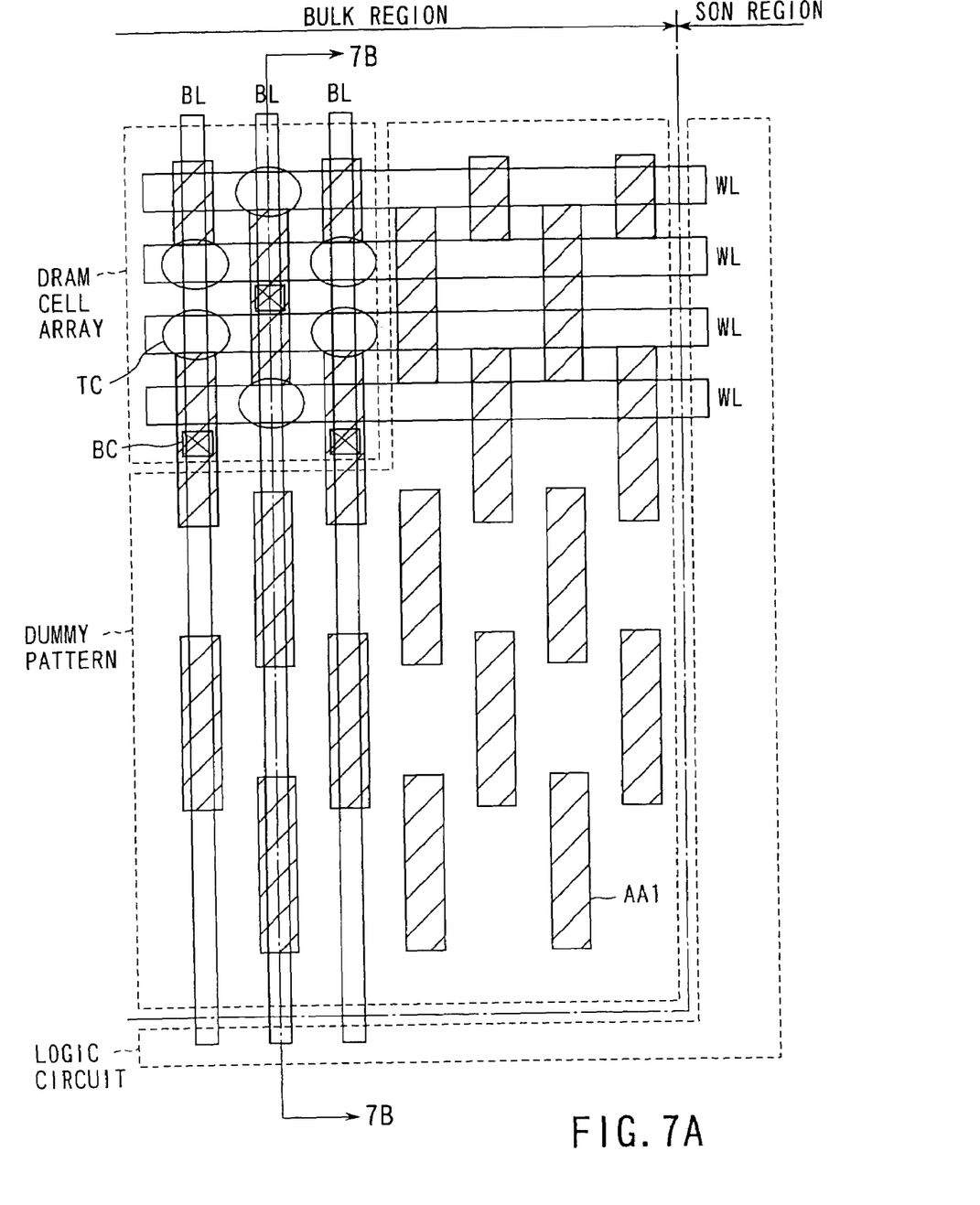
FIG. 7A is a plan view of a semiconductor device according to a third embodiment of the present invention.

A semiconductor device according to a third embodiment of the present invention will be explained by reference to FIG. 7A. The third embodiment is such that the second embodiment is applied to a system LSI embedded DRAM. FIG. 7A is a plan view of a system LSI embedded DRAM.

As shown in FIG. 7A, a DRAM cell array is formed in a bulk region and a logic circuit is formed in an SON region. A dummy pattern for the DRAM cells is formed in the bulk region (hereinafter, referred to as a boundary region) in contact with the SON region.

In the bulk region, a plurality of element regions AA1 are arranged in a staggered manner. The shaded regions in FIG. 7A represent element regions AA1. Element isolating regions are provided in the regions other than the element regions AA1. Each element region is so formed that it has a length of 4F (F: minimum processing dimension) in the longitudinal direction and a width of 2F in the direction perpendicular to the longitudinal direction. The DRAM cell array includes a plurality of memory cells, each having a cell transistor provided in an element region AA1 and a trench-type cell capacitor TC provided so as to be in contact with both ends of the element region AA1 in the longitudinal direction. A plurality of bit lines BL electrically connected via bit-line contact plugs BC to the memory cells located in the same column are arranged along the longitudinal direction of the element region AA1. a plurality of word lines WL electrically connected to the gate electrodes of the cell transistors in the same row are arranged in the direction perpendicular to the longitudinal direction of the element region AA1.

In the boundary region, element regions AA1 which have the same pattern as that of the DRAM cells are formed. These element regions constitute a dummy pattern which is not used in forming DRAM cells. In a DRAM or the like, an enormous number of memory cells are arranged regularly in an array. Its regularity, however, is disordered at the ends of the DRAM cell array. As a result, the photolithography conditions or etching conditions at the ends of the DRAM cell array tend to vary, which makes it difficult to maintain the reliability of the memory cells. To overcome this problem, a dummy pattern having the same pattern as that of the DRAM cell array is formed outside the DRAM cell array, thereby maintaining the reliability of the memory cells in the DRAM cell array. In the third embodiment, the dummy pattern is formed in the boundary region between the bulk region and the SON region.

In the SON region, a logic circuit is formed. An explanation of the logic circuit will be omitted.

Figure 7B:
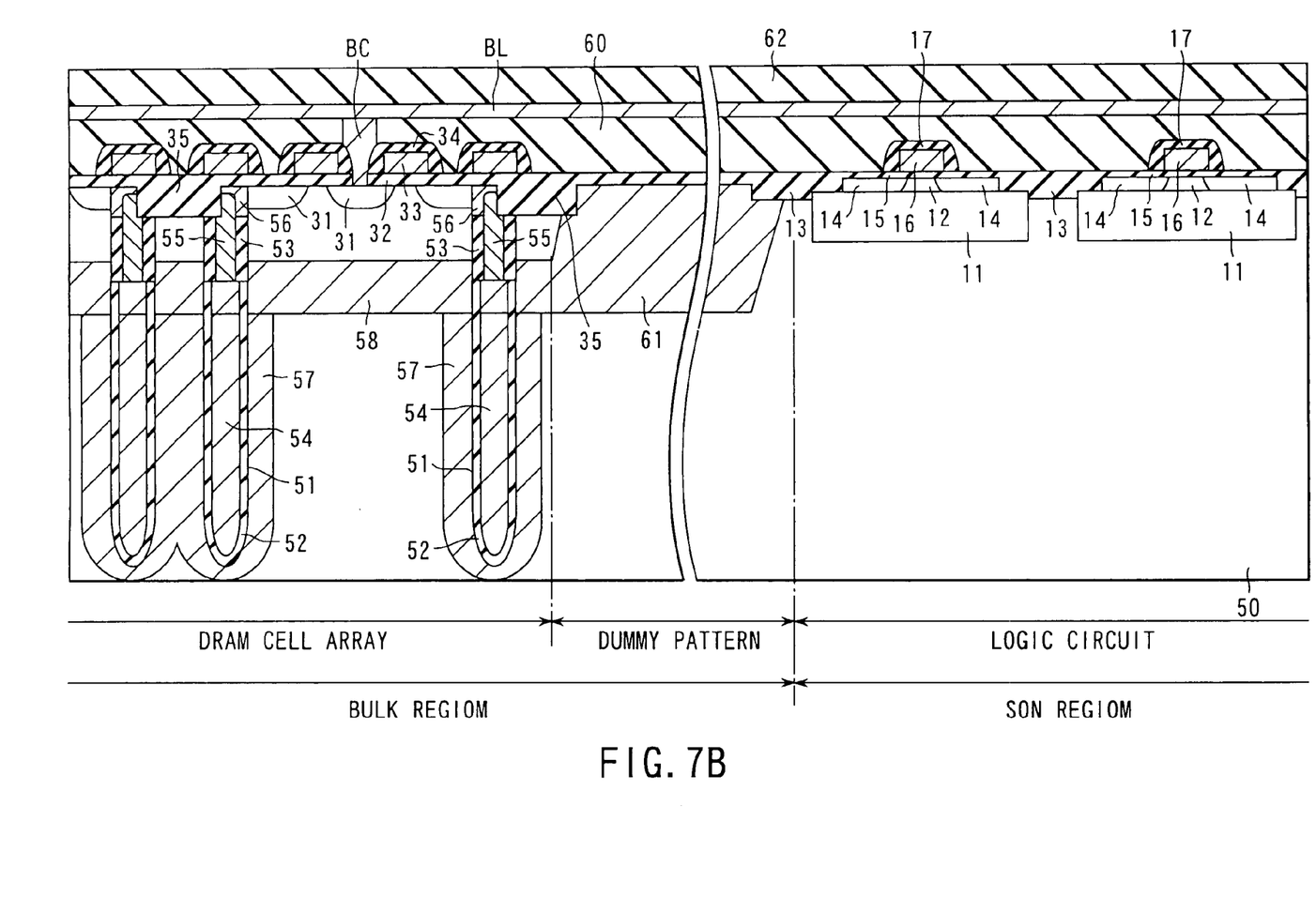
FIG. 7B is a sectional view taken along line 7B—7B of FIG. 7A.

A sectional structure of the system LSI shown in FIG. 7A will be explained by reference to FIG. 7B. FIG. 7B is a sectional view taken along line 7B-7B of FIG. 7A. A structure of the DRAM cell array in the bulk region will be first described.

In a p-type silicon substrate 50, a trench 51 for forming a trench capacitor TC is formed. A capacitor insulating film 52 is formed on all inner surface of the trench 51 except for an upper portion thereof. A collar oxide film 53 thicker than the capacitor insulating film 52 is formed on the upper portion of the inner surface of the trench 51, where the capacitor insulating film 52 is not formed, and except for the uppermost portion. A storage node electrode 54 is buried partway in the trench 51. A conductive material layer 55 is further formed on the storage node electrode 54. Moreover, a low-resistance conductive material layer 56 is further formed on the uppermost portion of the trench 51 near the opening portion. An $n^+$-type impurity diffused layer 57 is formed in the silicon substrate 50 in such a manner that it is in contact with the capacitor insulating film 52. The $n^+$-type impurity diffused layer 57 functions as a plate electrode. Furthermore, an n-type well region 58 connected in common to a plurality of $n^+$-type impurity diffused layers 57 is formed in the silicon substrate 50. Thus, a trench-type cell capacitor TC is formed.

A gate electrode 33 is formed on the silicon substrate 50 with a gate insulating film 32 interposed therebetween. An insulating film 34 is so provided that it covers the gate electrode 33. $N^+$-type source and drain regions 31 are formed in the surface of the silicon substrate 50, thereby forming a cell transistor. The source region 31 of the cell transistor is electrically connected to the conductive material layer 56 of the cell capacitor TC. A plurality of units of the DRAM cell including the cell transistor and cell capacitor are provided in the DRAM cell array. The DRAM cells are arranged in units of two cells in the elements AA1 electrically separated by the element isolating regions 35. The two DRAM cells in each pair share a drain region 31. The element isolating region 35 in the bulk region is formed by STI techniques as explained in the second embodiment.

An interlayer insulating film 60 is formed on the silicon substrate 50 to cover the DRAM cells. A bit-line contact plug BC extending from the surface of the interlayer insulating film 60 to the drain region 31 is formed in the interlayer insulating film 60. A bit line BL electrically connected to the bit-line contact plug BC is formed on the interlayer insulating film 60.

In the boundary region, that is, in the bulk region in contact with the SON region, element regions AA1 which have the same pattern as that of the DRAM cells are formed. No semiconductor element is formed there. An n-type well region 61 connected to the $n^+$-type impurity diffused layer 57 of the cell transistor is formed in such a manner that it reaches the surface of the silicon substrate 50. In this region, a plate potential is applied to the n-type well region 61.

In the SON region, a cavity 11 is made in the surface of the semiconductor substrate 50 as explained in the first and second embodiments. A region of the semiconductor substrate 10 located at the top of the cavity 11 is referred to a semiconductor layer 12. The semiconductor layer 12 is enclosed by an element isolating region 13. The element isolating region 13 is, of course, a silicon oxide film formed by oxidizing the semiconductor substrate 50 by LOCOS techniques. The semiconductor layer 12 is part of the semiconductor substrate 50. Source and drain regions 14, 14 are formed in the semiconductor layer 12. A gate electrode 16 is formed on the semiconductor layer 12 with a gate insulating film 15 interposed therebetween. In addition, an insulating film 17 is formed to cover the gate electrode. An interlayer insulating film 60 is formed on the semiconductor substrate 50.

Then, an interlayer insulating film 62 covers the DRAM cell array, dummy pattern, and logic circuit.

As described above, in the semiconductor device according to the third embodiment, a circuit required to have high controllability for leakage currents or threshold voltages, such as a DRAM cell array or a sense amplifier, is formed in the bulk region, whereas a logic circuit that carries out digital operations is formed in the SON region. Therefore, the DRAM cell array, sense amplifier, and logic circuit can be operated under the optimum conditions. This enables the system LSI to operate at higher speeds and have better performance.

While in the third embodiment, only the element regions AA1 have been provided in the boundary region, trench capacitors may be additionally formed. Dummy memory cells may, of course, be formed. The embodiment of the present invention is not limited to the system LSI embedded DRAM. For instance, the embodiment may be applied to a system LSI that includes an SRAM (Static RAM), a flash memory, a Ferroelectric RAM, or an MRAM (Magneto-resistive RAM). The third embodiment is not restricted to an LSI having a semiconductor memory device. It may be widely applied to the semiconductor devices including logic circuits and digital circuits.

As described above, in the semiconductor devices and the method of manufacturing the semiconductor devices according to the first to third embodiments, the element isolating region between cavities in the SON structure has been formed by LOCOS techniques. Moreover, the element isolating region is provided at and exposed to the sides of the cavities. As a result, not only is a useless space between the cavity and the element isolating region required, but also no well separation is needed. This enables the semiconductor devices to be miniaturized further. Since the size of the cavity is almost the same as that of the element region, this makes the manufacture easier, which improves the yield in manufacturing semiconductor devices. Furthermore, the SON structure is used for a circuit that carries out digital operations, whereas bulk silicon is used for a circuit that carries out analog operations, which enables each circuit to operate under the optimum conditions. This enables the system LSI to operate at higher speeds and have better performance.

Figure 8A:
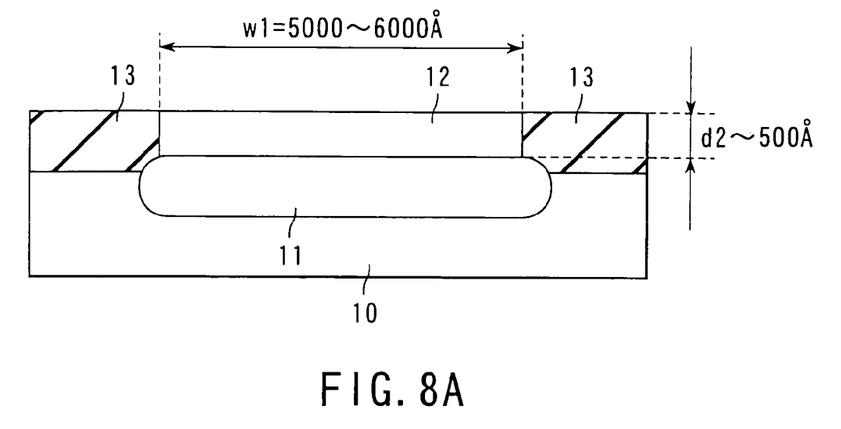
FIG. 8A is a sectional view of a part of a semiconductor device according to the first to third embodiments.

A MOS transistor using SON will be explained by reference to FIG. 8A. FIG. 8A is a sectional view of an SON structure. As shown in the figure, in a MOS transistor of the generation with a minimum processing dimension of 0.1 $\mu$m, the width W1 of the semiconductor layer 12 (or element region AA) is about 5000 to 6000 Å. The thickness d2 of the semiconductor layer 12 is about less than 500 Å. It is known that the thinner the semiconductor layer 12, the more the short channel effect can be prevented. Particularly, it is desirable that the thickness should be less than ¼ of the gate length.

Figure 8B:
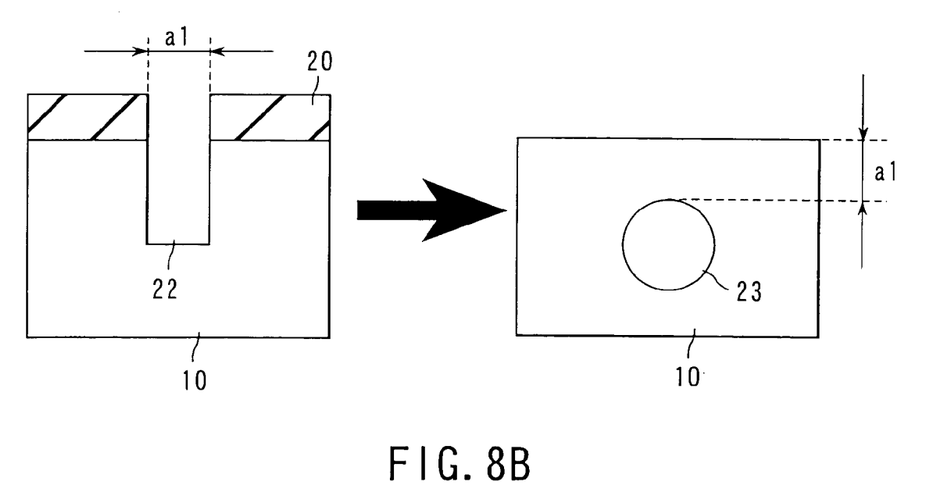
FIG. 8B is a sectional view showing a part of the manufacturing step of the semiconductor devices according to the first to third embodiments.

As shown in FIG. 8B, the film thickness of the semiconductor layer 12 is almost determined by the width of the opening of the trench 22 for forming a cavity 11. That is, if the width of the opening of the trench is a1, the film thickness of a semiconductor layer 12 formed by subsequent annealing is also about a1. Therefore, to make the film thickness d2 of the semiconductor layer 12 500 Å, the width a1 of the opening of the trench is made 500 Å.

As described above, the film thickness of the semiconductor layer 12 provided at the top of the cavity 11 is very small. Accordingly, the depth of the element isolating region 13 is small. That is, the element isolating region 13 is nearly as thick as the semiconductor layer 12. Therefore, even if the element isolating region 13 is formed by LOCOS techniques, bird's beaks cause almost no problem and therefore do not prevent the semiconductor devices from being miniaturized further.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a flat-plate-shaped cavity made in the semiconductor substrate; and
   an element isolating region formed in the surface of the semiconductor substrate and located at the sides of the cavity, the cavity being wider than an element region provided on the cavity;
   wherein the element isolating region is less deep than the cavity and deeper than the element region.

2. The semiconductor device according to claim 1, wherein the element isolating region and the cavity enclose the element region and electrically separate the element region from the semiconductor substrate.

3. The semiconductor device according to claim 1, wherein only one element region is provided on the cavity.

4. The semiconductor device according to claim 1, wherein the element isolating region is formed of an oxide film obtained by oxidizing the semiconductor substrate.

5. The semiconductor device according to claim 1, wherein the cavity has no element therein.

6. The method according to claim 1, wherein the cavity has no element therein.

7. A semiconductor device comprising:
   a semiconductor substrate;
   a plurality of flat-plate-shaped cavities made in the semiconductor substrate; and
   an element isolating region formed in the surface of the semiconductor substrate between adjacent ones of the cavities, a part of the element isolating region being exposed to the cavities, each cavity being wider than each element region provided on each cavity, respectively;
   wherein the element isolating region is less deep than the cavities and deeper than the element region.

8. The semiconductor device according to claim 7, wherein the element isolating region and the cavities enclose the element regions and electrically separate the element regions from the semiconductor substrate.

9. The semiconductor device according to claim 7, wherein only one element region is provided on the cavity.

10. The semiconductor device according to claim 7, wherein the element isolating region is formed of an oxide film obtained by oxidizing the semiconductor substrate.

11. The semiconductor device according to claim 7, wherein the cavity has no element therein.

12. A method of fabricating a semiconductor device, comprising:

making flat-plate-shaped cavities partly in a semiconductor substrate;

forming an insulating film in the surface of the semiconductor substrate between adjacent ones of the cavities in such a manner that a part of the insulating film is exposed to the cavities so as to electrically separate element regions provided on the cavities from each other, each cavity being wider than each element region; and forming semiconductor elements on the element regions;

wherein the insulating film is less deep than the cavities and deeper than the element region.

13. The method according to claim 12, wherein the insulating film is formed by oxidizing the surface of the semiconductor substrate.

14. The method according to claim 12, wherein the insulating film and the cavities enclose the element regions and electrically separate the element regions from the semiconductor substrate.

15. The method according to claim 12, wherein only one element region provided on each of the cavities.

* * * * *